United States Patent [19]

Nikawa

[11] Patent Number: 4,734,754
[45] Date of Patent: Mar. 29, 1988

[54] SEMICONDUCTOR DEVICE HAVING IMPROVED STRUCTURE OF MULTI-WIRING LAYERS

[75] Inventor: Kiyoshi Nikawa, Tokyo, Japan

[73] Assignee: NEC Corporation, Tokyo, Japan

[21] Appl. No.: 730,181

[22] Filed: May 3, 1985

[30] Foreign Application Priority Data

May 7, 1984 [JP] Japan .................. 59-90376

[51] Int. Cl.[4] .................. H01L 23/10; H01L 23/48; H01L 23/18
[52] U.S. Cl. .......................... 357/68; 357/71
[58] Field of Search .............. 357/68, 71, 54, 74, 357/78, 65

[56] References Cited

U.S. PATENT DOCUMENTS

| | | | |
|---|---|---|---|
| 3,735,208 | 5/1973 | Roswell et al. | 357/78 |
| 3,890,636 | 6/1975 | Harada et al. | 357/68 |
| 4,531,144 | 7/1985 | Holmberg | 357/65 |
| 4,544,941 | 10/1985 | Ariizumi et al. | 357/54 |
| 4,562,455 | 12/1985 | Okumura et al. | 357/65 |
| 4,600,624 | 7/1986 | Joseph et al. | 357/71 |

Primary Examiner—Martin H. Edlow
Assistant Examiner—S. V. Clark
Attorney, Agent, or Firm—Burns, Doane, Swecker & Mathis

[57] ABSTRACT

A semiconductor device comprises a lower wiring layer, an intermediate insulating film on the lower wiring layer and an upper wiring layer crossing the lower wiring layer via the intermediate insulating film. At least one opening is provided in the intermediate insulating film in the vicinity of the upper wiring layer but separated from the upper wiring layer to expose a surface portion of the lower wiring layer. In such a structure, when an electrical current flows through the lower wiring layer with a high density, whiskers or hillocks from the lower wiring layer grow definitively only in the opening, and hardly glow from a portion of the lower wiring layer under the upper wiring layer. Therefore, unwanted short-circuiting between the lower and upper wiring layers can be prevented.

7 Claims, 3 Drawing Figures

SEMICONDUCTOR DEVICE HAVING IMPROVED STRUCTURE OF MULTI-WIRING LAYERS

BACKGROUND OF THE INVENTION

The present invention relates to a semiconductor device having an improved structure of multi-wiring layers which prevents short-circuiting caused by electromigration.

In recent years, integration density of semiconductor devices such as IC's, LSI's and the like has increased, resulting in complex wiring patterns for interconnecting the elements. Therefore, the use of multi-wiring layers has also increased. The multi-wiring layers consist of a plurality of wiring layers via an intermediate insulating film, and the wiring layers are connected to each other and/or to predetermined parts of a semiconductor substrate through contact holes formed in the insulating film. The material of the wiring layer is mostly aluminum (Al), and the intermediate insulating film is made of silicon oxide ($SiO_2$), phosphorus silicate glass (PSG), silicon nitride ($Si_xN_y$), polyimide-type resin, or the like.

Aluminum has good electrical and thermal conductivities and adheres well to the semiconductor substrate or the insulating film such as $SiO_2$, and is easily patterned. Therefore, aluminum is widely used as a wiring material. However, the aluminum wiring layer often causes electromigration when the semiconductor device is operating with a large current density of $2 \times 10^5$ $A/cm^2$ to $5 \times 10^5$ $A/cm^2$. Electromigration is a phenomenon in which atoms migrate owing to interaction between the electrons and the atoms constituting the wiring. Progress of this phenomenon in aluminum wiring gives rise to the development of hillocks or crystalline whiskers consisting of aluminum atoms. The whiskers or hillocks from one wiring layer grow penetrating through the intermediate insulating film having a reduced thickness or through portions having small mechanical strength where the density may be relatively small, and reach another aluminum wiring layer positioned above or under the one wiring layer, resulting in short-circuiting between the two wiring layers. To restrain electromigration, copper has been added in small amounts to aluminum, or heat-treatment has been tried so as to increase the size of aluminum crystals, i.e., to decrease the density of grain boundaries, so that fewer aluminum atoms would migrate. These techniques have not given satisfactory results.

SUMMARY OF THE INVENTION

Accordingly, it is an object of the present invention to provide a semiconductor device which features increased reliability by reducing short-circuiting due to whiskers or hillocks that stem from electromigration.

According to one feature of the present invention, there is provided a semiconductor device comprising a semiconductor substrate, a first insulating film such as a field insulating layer formed on a major surface of the substrate, a first wiring layer such as of aluminum formed on the first insulating film, a second insulating film covering the first wiring film as an intermediate insulating film, a second wiring layer such as of aluminum crossing the first wiring layer on a first upper surface portion of the first wiring layer via the second insulating film, and an opening formed in the second insulating film so as to expose a second upper surface portion of the first wiring layer apart from the first upper surface portion. A plurality of the openings may be provided in the intermediate insulating film at portions where the second, that is, the upper wiring layer does not exist. Favorably, two openings are formed such that the second wiring layer extends between the two openings. According to various experiments, the distance between one opening and adjacent opening ranges favorably 30 $\mu$m to 100 $\mu$m in practical semiconductor devices.

In view of microphysics, the aluminum atoms migrate in different amounts in portions of aluminum wiring. The difference in the amount of aluminum atom migration is directly related to the difference in the internal stress in the aluminum wiring. If internal stress exceeds a certain value, the whiskers or hillocks grow through the insulating film.

Thus, whiskers or hillocks grow readily where severe internal stress builds up on the aluminum wiring and in the portions where the intermediate insulating film covering the aluminum wiring has little mechanical strength. Therefore, if openings are formed at optional intervals in the insulating film on the wiring through which a current of a high density flows during the operation, such as wiring for power sources, or emitter wiring for high-speed logic transistors in a bipolar IC, the whiskers or hillocks grow very readily in such opening portions, since these openings lack external force to mechanically resist against the internal stress in the aluminum wiring. With the whiskers or hillocks growing in the opening portions, internal stress decreases in the vicinity thereof, and internal stress which has accumulated in other portions of the aluminum wiring also decreases indirectly. Therefore, the whisker or hillock hardly grows from a portion of the aluminum wiring layer which is located right under an upper wiring layer and short-circuiting between the two wiring layers due to the whisker or hillock can be prevented.

DESCRIPTION OF THE PRIOR ART

Figure 1:
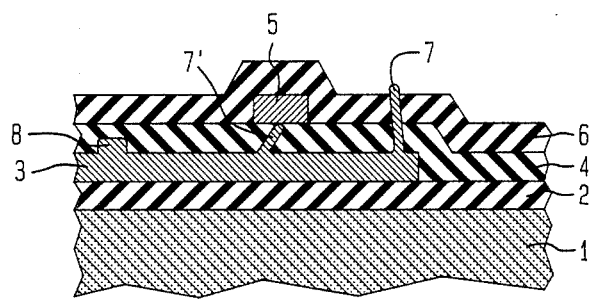
FIG. 1 is a cross-sectional view showing a semiconductor device of a prior.

Referring to FIG. 1, a first wiring layer 3 of aluminum, that is, a lower lavel wiring layer is formed on an insulating layer 2 such as a field oxide layer provided on a major surface of a semiconductor substrate 1 in which many circuit elements such as transistors, or diodes, etc. (not shown) are formed. An intermediate insulating film 4 such as of silicon oxide is formed on the first wiring layer 3 and on the insulating layer 2, and a second wiring layer 5 of aluminum is formed on the intermediate insulating film such that it crosses the first wiring layer 3 via the intermediate insulating film. The surface of the structure is covered with a passivation insulating film 6. When an electrical current flows in the first wiring layer 3 with a large current density of $2 \times 10^5$ $A/cm^2$ to $5 \times 10^5$ $A/cm^2$, sometimes whiskers 7, 7' or hillocks 8 grow on a first wiring layer 3, and the whisker 7' penetrating the intermediate film 4 causes the unwanted short-circuiting between the first and second wiring layers.

DESCRIPTION OF THE EMBODIMENT

Figure 2A:
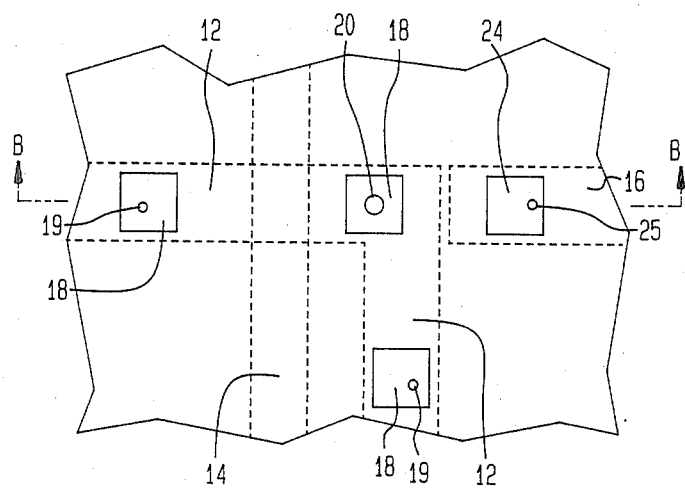
FIG. 2A is a plan view showing an embodiment of the present invention.
Figure 2B:
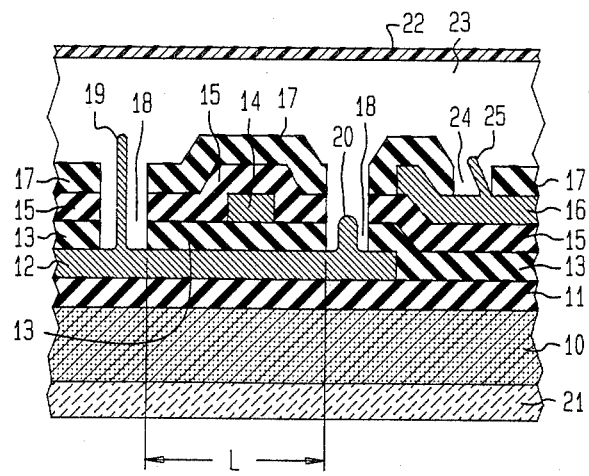
FIG. 2B is a cross-sectional view taken along line B—B' of the FIG. 2A.

Referring to FIGS. 2A and 2B, an insulating layer 11 of silicon di-oxide having 1 μm in thickness is formed on a major surface of a semiconductor substrate 10 in which many circuit elements such as transistors, diodes, etc. (not shown) are provided.

The insulating layer 11 may be used as a field insulating layer. A first wiring layer 12 of aluminum of 0.5 μm in thickness and 4 μm in width is formed on the insulating layer 11. Over the first wiring layer 12 and the insulating layer 11 a first intermediate insulating film 13 of silicon nitride having 1 μm in thickness is provided, and a second wiring layer 14 of aluminum of 0.5 μm in thickness and 6 μm in width is formed on the first intermediate insulating film 13 such that it crosses perpendicularly in the plan view with the first wiring layer 12 via the first intermediate insulating film 13. Further, a second intermediate insulating film 15 is formed on the second wiring layer 14 and on the first intermediate insulating film 13, and a third wiring layer 16 of aluminum having a thickness of 1 μm is formed on the second intermediate insulating film 15. The surface of the structure is covered with a surface protecting film, that is, a passivation film 17 of insulator. Openings 18 are provided on the first wiring layer 12 in the three insulating films 13, 15 and 17 to expose portions of the first wiring layer 12 above which the second wiring layer 14 is not provided. Namely, each opening 18 is formed where any upper wiring layer is not provided. The width and length of the opening 18 may be nearly equal to the width of the first wiring layer, and the distance L between the openings 18, 18 is favorably 30 to 100 μm. Also, a plurality of openings 24 (shown only one opening) are formed in the passivation film 17. Such a openings may be formed by the well known reactive ion etching. The semiconductor pellet (chip) is bonded at the other major surface, that is, the back surface of the semiconductor substrate to a ceramic body 21 of a ceramic package or a glass-sealed package. The package is sealed by a lid 22 to prevent moisture or the like from passing the opening, and in the package inert gas such as nitrogen or air is filled. Therefore, in the embodiment, portions of the first and third wiring layers within the openings are exposed to the inert gas or air.

When an electrical current flows in the first wiring layer 12 with a large current density of $2 \times 10^5$ A/cm² to $5 \times 10^5$ A/cm², whiskers 19 or hillocks 20 grow definitively only in the openings 18. However, in portions of the first aluminum wiring layer near the openings, aluminum atoms migrate in such small amounts that no stress is built up, and the whiskers or hillocks do not grow. Therefore, any whisker or hillock does not occur at a portion of the first wiring layer under the second wiring layer, and then unwanted short-circuiting between the first and second wiring layers can be prevented. In the embodiment, a large density current also flows in the third wiring layer 16, and therefore the openings 24 are provided in the insulating film 17 to grow whiskers 25 definitely only in the openings. However, in the second wiring layer 14, an electrical current flows with a small density, and therefore, any opening is not necessary above the second wiring layer.

According to the construction of the present invention as described above, short-circuiting by whiskers or hillocks is prevented. The effect is even greater when the conventional method is also employed to restrain the migration of aluminum atoms by adding copper or like elements to aluminum.

In the present invention as described above in detail, lower layer wiring is not covered with insulating film in a portion where there is formed no upper layer wiring, so as to obtain a semiconductor device which lessens the probability of short-circuiting caused by whiskers or hillocks steming from electromigration, and which features increased reliability.

What is claimed is:

1. A semiconductor device comprising a semiconductor chip and a housing hermetically containing said semiconductor chip therein, said semiconductor chip including a semiconductor substrate, an insulating layer formed on a major surface of said semiconductor substrate, a first wiring layer including aluminum formed on said insulating layer and extending in one direction, an intermediate insulating film provided on said first wiring layer and on said insulating layer, a second wiring layer formed on said intermediate insulating film and partially overlapping said first wiring layer via said intermediate insulating film, and an opening formed in said intermediate insulating film at a location where said first wiring layer is present thereunder and said second wiring layer is absent thereabove to expose the surface of said first wiring layer within said housing.

2. A semiconductor device of claim 1, in which said opening has a square shape in the plan view.

3. A semiconductor device of claim 2, in which the width of said square shape of said opening is substantially equal to the width of said first wiring layer.

4. A semiconductor device of claim 1, in which said first wiring layer within said opening is exposed to gas sealed in said housing.

5. A semiconductor device comprising a semiconductor chip and a package containing said semiconductor chip therein, said semiconductor chip including a semiconductor substrate, an insulating layer formed on a major surface of said semiconductor substrate, a lower level wiring layer formed on said insulating layer and extending in one direction, an intermediate insulating film formed on said lower level wiring layer and on said insulating layer, an upper level wiring layer extending in a direction different from said one direction and partially overlapping said lower level wiring layer via said intermediate insulating film, a first opening formed in said intermediate insulating film at a location where said lower level wiring layer is present thereunder and said upper level wiring layer is absent thereabove to expose the surface of said lower level wiring layer to gas sealed within said package, wherein said gas is inert gas or air, and a second opening formed in said intermediate insulating film at a location where said lower level wiring layer is present thereunder and said upper level wiring layer is absent thereabove to expose the surface of said lower level wiring layer to gas sealed within said package, wherein said gas is inert gas or air, said first opening being positioned to one side of and said second opening being positioned to the opposite side of said upper level wiring layer.

6. A semiconductor device of claim 5, in which the distance between said first and second openings ranges from 30 μm to 100 μm.

7. A semiconductor device of claim 5, in which said lower level wiring layer is made of aluminum, and said upper level wiring layer is made of aluminum.

* * * * *